United States Patent [19]

Moulding

[11] Patent Number: 4,518,878
[45] Date of Patent: May 21, 1985

[54] "ALL-PASS" FILTER CIRCUIT INCLUDING AN INTEGRABLE BAND-PASS FILTER CIRCUIT

[75] Inventor: Kenneth W. Moulding, Horley, England

[73] Assignee: U.S. Philips Corporation, New York, N.Y.

[21] Appl. No.: 433,610

[22] Filed: Oct. 12, 1982

[30] Foreign Application Priority Data

Oct. 30, 1981 [GB] United Kingdom ............... 8132756

[51] Int. Cl.³ .................... H03H 11/08; H03H 11/18
[52] U.S. Cl. ................................. 307/520; 307/529; 307/602; 328/167; 330/306
[58] Field of Search ............................ 307/510–511, 307/520–521, 529, 262, 590–591, 602–603; 328/24, 155, 167; 330/107, 109, 294, 302, 306

[56] References Cited

U.S. PATENT DOCUMENTS

| 3,581,122 | 5/1971 | Gaunt, Jr. ...................... 307/520 |
| 3,852,624 | 12/1974 | Marik et al. .................... 307/511 |
| 3,860,954 | 1/1975 | Tsuchiya ........................ 307/511 X |
| 4,051,519 | 9/1977 | Harwood ........................ 307/511 X |
| 4,052,679 | 10/1977 | Hosoya .......................... 328/155 X |
| 4,136,289 | 1/1979 | Furihata et al. ................ 307/511 X |
| 4,356,460 | 10/1982 | Cunningham .................... 330/294 X |
| 4,422,052 | 12/1983 | Yorkanis et al. ................ 330/294 X |

OTHER PUBLICATIONS

Moschytz, "Inductorless Filters: A Survey" (part II), IEEE Spectrum, Sep., 1970, pp. 63–75.

Primary Examiner—Stanley D. Miller
Assistant Examiner—D. R. Hudspeth
Attorney, Agent, or Firm—Thomas A. Briody; William J. Streeter; Edward W. Goodman

[57] ABSTRACT

An "all-pass" filter circuit for use, for example, as a delay section in an integrated circuit, and which should therefore be as simple and as little susceptible to production spreads as possible, comprises first and second long-tailed pairs of transistors (1, 2 and 3, 4 respectively) provided with input emitter followers (26, 28, 30, 32). The pairs are interconnected to form a gyrator having first and second ports (24 and 25 respectively). The first port is loaded by a first capacitor (17) shunted by a damping resistor (22) and the second port is loaded by a second capacitor (18). An input terminal (20) is coupled to the first port via one transistor (1) of the first pair and the relevant emitter follower (26), and the first port is coupled to an output terminal (21) via both transistors (3, 4) of the second pair and the relevant emitter follower (30). A portion of the input signal is added to the output signal in a suitable phase via a second resistor (23) which connects the emitter of the input emitter follower (20) to the emitter of the fourth, grounded-base, emitter follower (32) the collector of which is connected to the output terminal (21). The value of the second resistor is chosen so that the arrangement constitutes an "all-pass" filter circuit. If desired the collector connections of the transistors of the first pair may be interchanged provided that those of the transistors of the second pair are also interchanged. If desired the emitter followers may be omitted, the second resistor then being connected between the emitters of the first transistor (1) of the first pair and the second transistor (4) of the second pair.

7 Claims, 2 Drawing Figures

"ALL-PASS" FILTER CIRCUIT INCLUDING AN INTEGRABLE BAND-PASS FILTER CIRCUIT

BACKGROUND OF THE INVENTION

This invention relates to a circuit arrangement comprising a first long-tailed pair of first and second transistors, a second long-tailed pair of third and fourth transistors, a first load impedance connected to the output electrode of one transistor of the first pair, second and third load impedances connected to the output electrodes of the third and fourth transistors, respectively, a first coupling from said first load impedance to the control electrode of one transistor of the second pair, a second coupling from said second load impedance to the control electrode of said second transistor, first and second capacitive elements connecting said first and second couplings, respectively, to a reference potential point so that a first voltage-to-current converter, including said one transistor of the second pair, couples said first capacitive element to said second capacitive element and a second voltage-to-current converter, including said second transistor, couples said second capacitive element to said first capacitive element, the signal path through one of said converters passing through only one transistor of the corresponding pair so that said one converter is inverting, the signal path through the other of said converters passing through both transistors of the corresponding pair so that said other converter is non-inverting, a third coupling from a signal input to the control electrode of said first transistor so that a first amplifier including said first transistor couples said signal input to said first capacitive element, a fourth coupling from a reference potential point to the control electrode of the other transistor of the second pair, a fifth coupling from said third load impedance to a signal output so that a second amplifier including said fourth transistor couples said first capacitive element to said signal output, and a resistor included in series or parallel with a said capacitive element.

An arrangement of the kind set forth is disclosed in, for example, an article entitled "A fully integrated five-gyrator filter at video frequencies" by K. W. Moulding and G. A. Wilson, in "IEEE Journal of Solid-state circuits", Vol. SC-13, No. 3, June 1978, pages 303–307, particularly FIG. 7 on page 305. This known arrangement operates as a band-pass filter: the interconnected first and second voltage-to-current converters constitute a gyrator circuit the two ports of which are loaded by the first and second capacitive elements, respectively. Consequently the port to which the first capacitive element is connected appears inductive (because of the loading of the other port by the second capacitive element), so that if an input signal is applied (via the first amplifier) to the parallel combination of the first capacitive element and the relevant port, and the signal appearing across this parallel combination is taken off via the second amplifier, the input/output characteristic will have a second order band-pass nature.

There is considerable emphasis at the present time on constructing electronic circuitry, as much as possible in integrated circuit form, in the interests of cost reduction and reliability. Indeed, the possible replacement of filter circuits constituted by discrete inductors and capacitors by integrated circuits, particularly in television receivers, was the reason for the development of the known band-pass filter. Another television receiver component which it would be desirable to construct in integrated circuit form is the so-called "luminance delay line" which normally has to be provided in order that the television luminance signal be subjected to the same overall delay in the receiver as is the chrominance signal. The luminance delay line normally has to produce a delay of approximately 400 nS and should, of course, have a substantially constant amplitude-versus-frequency characteristic over the entire frequency range of the luminance signal and a substantially linear phase response over this range. In theory, an appropriate so-called "all-pass" network where, to permit integration, any inductance required is constituted by one port of a gyrator circuit, the other port of which is capacitively-loaded, could have these properties. To be successful such a network constructed in integrated circuit form should contain as few circuit elements as possible (to minimize the chip area required) and be designed so that its overall properties are as little sensitive as possible to production spreads occurring in the manufacture of the circuit. It is an object of the invention to provide an "all-pass" circuit arrangement which can have these features.

SUMMARY OF THE INVENTION

The invention provides a circuit arrangement comprising a first long-tailed pair of first and second transistors, a second long-tailed pair of third and fourth transistors, a first load impedance connected to the output electrode of one transistor of the first pair, second and third load impedances connected to the output electrodes of the third and fourth transistors, respectively, a first coupling from said first load impedance to the control electrode of one transistor of the second pair, a second coupling from said second load impedance to the control electrode of said second transistor, first and second capacitive elements connecting said first and second couplings respectively, to a reference potential point so that a first voltage-to-current converter, including said one transistor of the second pair, couples said first capacitive element to said second capacitive element and a second voltage-to-current converter, including said second transistor, couples said second capacitive element to said first capacitive element, the signal path through one of said converters passing through only one transistor of the corresponding pair so that said one converter is inverting, the signal path through the other of said converters passing through both transistors of the corresponding pair so that said other converter is non-inverting, a third coupling from a signal input to the control electrode of said first transistor so that a first amplifier including said first transistor couples said signal input to said first capacitive element, a fourth coupling from a reference potential point to the control electrode of the other transistor of the second pair, a fifth coupling from said third load impedance to a signal output so that a second amplifier including said fourth transistor couples said first capacitive element to said output, and a resistor included in series or parallel with a said capacitive element, characterized in that a second resistor connects a common electrode of a transistor, included in the signal path from said signal input to the output electrode of said first transistor, to a common electrode of a transistor, which is included in the signal path from the last-mentioned reference potential point to the output electrode of said other transistor of the second pair, and which has its output electrode connected to said signal output, so that a non-inverting signal path exists from said signal input to said signal output via said second resistor, said second resistor having a value such that the circuit arrangement constitutes an "all-pass" circuit arrangement.

The reference potential points may all be constituted by the same point if desired.

It has now been recognized that an "all-pass" circuit arrangement can be obtained by the mere addition of a second resistor of an appropriate value to a circuit arrangement of the kind set forth in the first paragraph of this specification. As this arrangement of the kind set forth has a configuration which lends itself to simplicity and to the arrangement being relatively insensitive to production spreads (e.g. because of the employment of long-tailed pairs), an "all-pass" circuit arrangement obtained by the mere addition of a second resistor thereto can have similar properties.

It should be noted that it is known (see, for example, the book "Passive and Active Network Analysis and Synthesis" by Aram Budak (Haughton Mifflin Co.) page 445) that a second-order "all-pass" function can be formed by subtracting an appropriate constant from a second-order bandpass function:

$$\frac{SW_o}{S^2 + SW_o/Q + W_o^2} - \frac{Q}{2} = \frac{Q}{2} \frac{S^2 - SW_o/Q + W_o^2}{S^2 + SW_o/Q + W_o^2}$$

(where $S = jW$) In other words, an all-pass network can be obtained by shunting the signal path through a bandpass filter having a particular quality factor $Q$ by an inverting amplifier having a gain of $Q/2$.

If said first coupling extends from said first load impedance to the control electrode of said third transistor, the transistor included in the signal path from said signal input to the output electrode of said first transistor, may be constituted by said first transistor, and said transistor which is included in the signal path from said last-mentioned reference potential point to the output electrode of said other transistor of the second pair may be constituted by said fourth transistor. This can give a particularly simple arrangement but is liable to result in an appreciable degree of interaction between the two signal paths between signal input and signal output (via the first capacitive element and via the second resistor respectively). Such interaction can be reduced by arranging that the first and fourth transistors each have a first common electrode which is connected to the tail of the corresponding pair and a second common electrode which is connected to the second resistor.

An alternative way of obtaining reduced interaction between the two paths is to arrange that the transistor included in the signal path from said signal input to the output electrode of said first transistor, is constituted by a fifth transistor, to the control electrode of which said signal input is connected, said fifth transistor having its common electrode connected to the control electrode of said first transistor, and said transistor which is included in the signal path from the last-mentioned reference potential point to the output electrode of said other transistor of the second pair, is constituted by a sixth transistor, to the control electrode of which said last-mentioned reference potential point is connected, said sixth transistor having its common electrode connected to the control electrode of said other transistor of the second pair. If this is the case, then, in the interest of symmetry, and in order to facilitate d.c. coupling throughout (if desired), said first capacitive element may be connected to said first load impedance, said second capacitive element may be connected to said second load impedance, said first coupling may include a seventh transistor having its control electrode connected to said first load impedance and its common electrode connected to the control electrode of said one transistor of the second pair, and said second coupling may comprise an eighth transistor having its control electrode connected to said second load impedance and its common electrode connected to the control electrode of said second transistor.

DESCRIPTION OF THE DRAWINGS

Embodiments of the invention will now be described, by way of example, with reference to the accompanying diagrammatic drawings in which.

DESCRIPTION OF THE PREFERRED EMBODIMENTS

Figure 1:
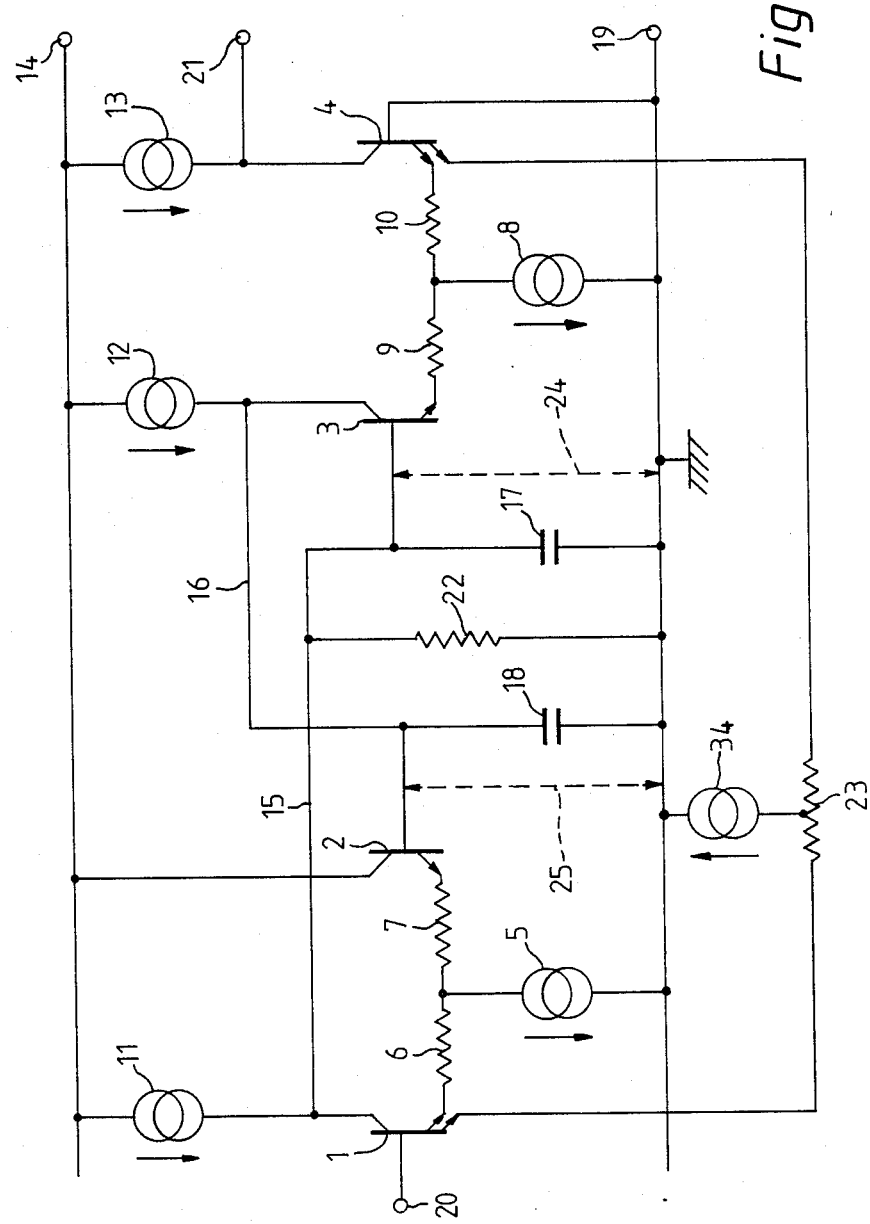
FIG. 1 is the circuit diagram of a first embodiment of the invention.

In FIG. 1 an "all-pass" circuit arrangement comprises a first long-tailed pair of transistors 1 and 2 and a second long-tailed pair of transistors 3 and 4, common electrodes, or emitters, of transistors 1 and 2 being connected to the output of a constant current source 5 via equal-value resistors 6 and 7, respectively, and common electrodes, or emitters, of transistors 3 and 4 being connected to the output of a constant current source 8 via equal-value resistors 9 and 10, respectively. First, second and third load impedances in the form of constant current sources 11, 12 and 13 respectively, connect the output electrodes, or collectors, of the transistors 1, 3 and 4, respectively, to a positive voltage supply terminal 14, the output electrode, or collector, of transistor 2 being connected to terminal 14 directly.

A first coupling 15 extends from the first load impedance 11 to the control electrode, or base, of transistor 3 and a second coupling 16 extends from the second load impedance 12 to the control electrode, or base, of transistor 2. First and second capacitive elements 17 and 18, respectively, (which may be, for example, reverse-biassed p-n junctions) connect the couplings 15 and 16, respectively, to a reference potential point 19 (ground) so that a first, inverting, voltage-to-current converter including transistor 3 couples capacitor 17 to capacitor 18, and a second, non-inverting, voltage-to-current converter including transistors 2 and 1 couples capacitor 18 to capacitor 17.

A signal input terminal 20 is connected to the control electrode, or base, of transistor 1 so that a first inverting amplifier, including transistor 1, couples input terminal 20 to capacitor 17. The reference potential point 19 (ground) is connected to the control electrode, or base, of transistor 4. The common point of constant current source 13 and the output electrode, or collector, of transistor 4 is connected to a signal output terminal 21 so that a second, non-inverting amplifier, including transistors 3 and 4, couples capacitor 17 to output terminal 21. A quality factor Q-determining resistor 22 is connected in parallel with capacitor 17. A second resistor 23 connects a second common electrode, or emitter, of transistor 1 to a second common electrode, or emitter, of transistor 4 so that a non-inverting signal path exists from input terminal 20 to output terminal 21 via resistor 23. The second emitters of transistors 1 and 4 are supplied with suitable forward bias currents by means of a constant current source 34 connected between ground and a center tap on resistor 23.

In the absence of resistor 23, the circuit of FIG. 1 would constitute a band-pass filter, the interconnected aforesaid first inverting and second non-inverting voltage-to-current converters forming a gyrator circuit, across a first port 24 of which is connected the parallel combination of capacitor 17 and resistor 22 and across a second port 25 of which is connected capacitor 18. The port 24 therefore appears inductive to the parallel combination of capacitor 17 and resistor 22, so that in the presence of capacitor 17 and resistor 22, the terminals of the port 24 operate as the terminals of a damped parallel-resonant circuit. If an input signal is applied to terminal 20, it will be applied to this parallel-resonant circuit in an inverted manner via transistor 1, and the signal across this parallel-resonant circuit will be fed to output terminal 21 in non-inverted form via transistors 3 and 4. The resonant frequency $W_o$ of the resonant circuit is ideally given by $$W_o = g_o(C_1C_2)^{-\frac{1}{2}}$$

where $C_1$ and $C_2$ are the capacitances of the capacitors 17 and 18, and $g_o$ is the magnitude of the transconductance of each of the aforesaid voltage-to-current converters (assuming that both converters have transconductances of the same magnitude, which is not necessarily the case). If $R_1$ and $R_2$ are the sum of the resistances of resistors 6 and 7 and the sum of the resistances of resistors 9 and 10, respectively, the above expression for $W_o$ becomes $$W_o = (R_1R_2C_1C_2)^{-\frac{1}{2}}$$

At high frequencies these (ideal) expressions for $W_o$ may be modified by the presence of parasitic reactances.

The presence of resistor 23 results in a signal proportional to the input signal at terminal 20 being added to the output signal of the basic bandpass arrangement at terminal 21. This signal is effectively added in an antiphase manner (because inversion occurs in the signal path from terminal 20 to terminal 21 via port 24) and the value of resistor 23 is chosen so that the gain therefor from terminal 20 to terminal 21 is equal to Q/2, where Q is the quality factor of the aforesaid damped parallel resonant circuit (equal to the ratio of the value of resistor 22 to the reactance of capacitor 17 at the resonant frequency $W_o$). In order to achieve this value of gain, the resistance $R_3$ of resistor 23 should be chosen so that $$R_3 = 2/(W_oC_2Q) - R_1$$

where $C_2$ and $R_1$ are as defined previously (assuming transistor emitter resistance can be neglected compared with $R_1$ and $R_2$ and that the impedance of constant current source 34 is large with respect to $R_3$).

The complete arrangement therefore constitutes an "all-pass" circuit arrangement.

Although the base of transistor 4 is shown, for simplicity, as being connected directly to ground it will in practice be connected in known manner to a suitable source of bias potential so that the long-tailed pair 3, 4 is balanced in the quiescent state. The d.c. level at input terminal 20 should, of course, be chosen so that long-tailed pair 1, 2 is also balanced in the quiescent state. Moreover, the values of resistors 6, 7, 9 and 10 and the output currents of current sources 5, 8, 12 and 13 should be chosen so that, in the quiescent state, the potentials at the two ends of resistor 23 are equal. The values of the resistors 6, 7, 9 and 10 may be on the order of, for example, 1 kohm. The various "constant" current sources may be constituted, for example, by high-value resistors, suitably biassed transistors in common emitter mode (pnp transistors for the sources 11, 12 and 13, and npn transistors for the sources 5, 8 and 34), or depletion mode FETs having their gates connected to their sources (p-channel FETs for the sources 11, 12 and 13, and n-channel FETs for the sources 5, 8 and 34).

Although resistor 23 is shown interconnecting second emitters provided on the transistors 1 and 4, transistors 1 and 4 may, as an alternative, be single-emitter transistors, one end of resistor 6 and one end of resistor 23 then being connected to the emitter of transistor 1, and constant current source 34 then being omitted. Although this alternative is slightly simpler than the arrangement shown, more interaction is likely to occur therein between the two signal paths from terminal 20 to terminal 21 than in the arrangement shown. The various bipolar transistors may, in this alternative, be replaced by field-effect transistors.

If desired the base of each transistor of FIG. 1 may be fed via an individual emitter follower (not shown) having an emitter load resistor the value of which is in the order of for example, 10 kohms. Such emitter followers can provide d.c. level shifts where required because of the d.c. couplings used. If such emitter followers are provided, resistor 23 may be connected between the emitters of the emitter follower transistors which feed the bases of transistors 1 and 4, rather than between the emitters of transistors 1 and 4 themselves, provided that the collector of the emitter follower which feeds the base of transistor 4, is connected to output terminal 21. (The output current from resistor 23 must appear at output terminal 21). Such an arrangement is shown in FIG. 2, in which corresponding components have been given the same reference numerals as their counterparts in FIG. 1.

Figure 2:
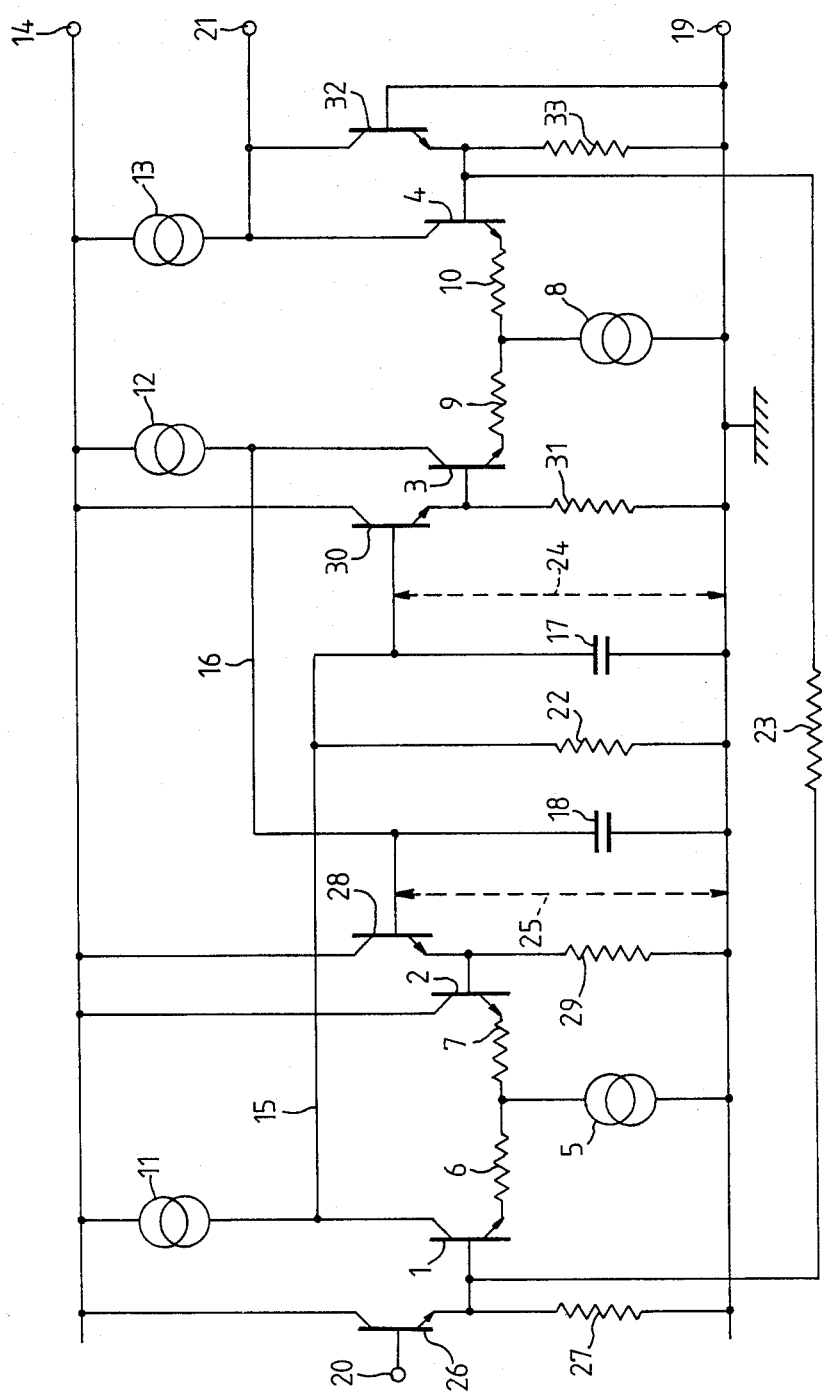
FIG. 2 is the circuit diagram of a second embodiment.

The arrangement of FIG. 2 is similar to that of FIG. 1 but transistor 1 is now fed from input terminal 20 via a fifth, emitter-follower, transistor 26 having an emitter resistor 27. The base of transistor 4 is connected to the emitter of a sixth transistor 32, the collector of which is connected to output terminal 21, the base of which is connected to ground (in practice to a source of suitable forward bias potential similarly to the base of transistor 4 in FIG. 1) and the emitter of which is connected to ground via a resistor 33. Transistor 3 is fed from capacitor 17 via a seventh, emitter-follower, transistor 30 having an emitter resistor 31, and transistor 2 is fed from capacitor 18 via an eighth, emitter-follower, transistor 28 having an emitter resistor 29. Resistor 23 is now connected between the emitter of transistor 26 and the emitter of transistor 32.

The arrangement of FIG. 2 operates in a similar manner to that of FIG. 1, the various emitter-follower transistors providing d.c. level shifts where required. Because of the changed connection points of resistor 23, the expression for its value $R_3$ in terms of certain of the other parameters of the arrangement, if the arrangement is to constitute an all-pass circuit, is slightly different from that applicable to the arrangement of FIG. 1. For FIG. 2 this expression becomes $$R_3 = 2/(W_oC_2Q)$$

where the various symbols have the same significance as before.

Similarly to FIG. 1, the d.c. potentials at terminal 20 and at the base of transistor 32 should be chosen so that the pairs 1, 2 and 3,4 are each balanced in the quiescent state, and the values of resistors 27 and 33 should be chosen so that the potentials at the two ends of resistor 23 are equal. Again the values of the resistors 6, 7, 9, 10 may be in the order of 1 Kohm, and the values of the emitter resistors 27, 29, 31, 33 may be in the order of 10 Kohms. Again the various "constant" current sources may be constituted by high-value resistors, suitably biassed transistors in common emitter mode, or depletion mode FETs having their gates connected to their sources, as described for the arrangement of FIG. 1. The various bipolar transistors shown in FIG. 2 may be replaced by field-effect transistors if desired, and, of course, all transistors may be replaced by transistors of the opposite conductivity type if the supply potential is reversed.

Resistor 22 may be included in series with capacitor 17 instead of in parallel with it, in which case the quality factor Q of the circuit will be the ratio of the reactance of capacitor 17 at the frequency $W_o$ to the resistance of resistor 22. As further alternatives, resistor 22 may be transferred to a point in the arrangement either in series with or in parallel with capacitor 18, in which cases the quality factor Q of the circuit will be the ratio of the reactance of capacitor 18 at the frequency $W_o$ to the resistance of resistor 22, and the ratio of the resistance of resistor 22 to the reactance of capacitor 18 at the frequency $W_o$, respectively.

Instead of returning the capacitive elements 17 and 18 to ground as shown in FIGS. 1 and 2, they may be returned to another constant potential point or points, for example to a source of suitable reverse-bias potential if they are constituted by reverse-biassed p-n junctions. Obviously it is preferable in such a case to include resistor 22 in series with, rather than in parallel with, one of the elements 17 and 18.

The arrangement of FIG. 2 may be modified, if desired, by interchanging the collector connections of transistors 1 and 2, and interchanging the collector connections of transistors 3 and 4, so that the collector of transistor 1 is connected to the terminal 14, the collector of transistor 2 is connected to source 11, capacitor 17 and resistor 22, the collector of transistor 3 is connected to source 13, terminal 21 and the collector of transistor 32, and the collector of transistor 4 is connected to source 12 and capacitor 18. If this is done, the signal path from capacitor 17 to capacitor 18 will be non-inverting, the signal path from capacitor 18 to capacitor 17 will be inverting, the signal path from input terminal 20 to capacitor 17 will be non-inverting, and the signal path from capacitor 17 to output terminal 22 will be inverting.

A practical arrangement constructed as described with reference to FIG. 2 and having a quality factor Q of 0.65, produced a delay of 100 nS and operated satisfactorily for input signal frequencies up to 5 MHz. Obviously several such arrangements may be cascaded to give greater delays than these obtainable with one alone.

I claim:

1. An all-pass filter circuit having a circuit arrangement comprising a first long-tailed pair of first and second transistors, a second long-tailed pair of third and fourth transistors, a first load impedance connected between a first supply potential node and an output electrode of one transistor of the first pair, second and third load impedances connected, respectively, between second and third supply potential nodes and output electrodes of the third and fourth transistors, respectively, an output electrode of the other transistor of said first pair being connected to a fourth supply potential node, a first means for coupling said first load impedance to a control electrode of one transistor of the second pair, a second means for coupling said second load impedance to a control electrode of said second transistor, first and second capacitive elements connecting said first and second coupling means, respectively, to a first reference potential node so that a first voltage-to-current converter, including said one transistor of the second pair, couples said first capacitive element to said second capacitive element and a second voltage-to-current converter, including said second transistor, couples said second capacitive element to said first capacitive element, the signal path through one of the said converters passing through only one transistor of the corresponding pair so that said one converter is inverting, the signal path through the other of said converters passing through both transistors of the corresponding pair so that said other of said converters is non-inverting, a third means for coupling a signal input to a control electrode of said first transistor so that a first amplifier, including said first transistor, couples said signal input to said first capacitive element, a fourth means for coupling a second reference potential node to a control electrode of the other transistor of the second pair, a fifth means for coupling said third load impedance to a signal output so that a second amplifier, including said fourth transistor, couples said first capacitive element to said signal output, and a resistor included in parallel with said capacitive element, characterized in that said all-pass filter circuit further comprises a second resistor connecting a common electrode of a transistor, included in the signal path from said signal input to the output electrode of said first transistor, to a common electrode of a transistor, which is included in the signal path from the second reference potential node to the output electrode of said other transistor of the second pair, and which has its output electrode connected to said signal output, so that a non-inverting signal path exists from said signal input to said signal output via said second resistor, said second resistor having a value such that the circuit arrangement constitutes said "all-pass" filter circuit.

2. An all-pass filter circuit having a circuit arrangement comprising a first long-tailed pair of first and second transistors, a second long-tailed pair of third and fourth transistors, a first load impedance connected between a first supply potential node and an output electrode of one transistor of the first pair, second and third load impedances connected, respectively, between second and third supply potential nodes and output electrodes of the third and fourth transistors, respectively, an output electrode of the other of said first pair being connected to a fourth supply potential node, a first means for coupling said first load impedance to a control electrode of one transistor of the second pair, a second means for coupling said second load impedance to a control electrode of said second transistor, first and second capacitive elements connecting said first and second coupling means, respectively, to a first reference potential node so that a first voltage-to-current converter, including said one transistor of the second pair, couples said first capacitive element to said second capacitive element and a second voltage-to-current converter, including said second transistor, couples said second capacitive element to said first capacitive element, the signal path through one of said converters passing through only one transistor of the corresponding pair so that said one converter is inverting, the signal path through the other of said converters passing through both transistors of the corresponding pair so that said other of said converters is non-inverting, a third means for coupling a signal input to a control electrode of said first transistor so that a first amplifier, including said first transistor, couples said signal input to said first capacitive element, a fourth means for coupling a second reference potential node to a control electrode of the other transistor of the second pair, a fifth means for coupling said third load impedance to a signal output so that a second amplifier, including said fourth transistor, couples said first capacitive element to said signal output, and a resistor included in series with said capacitive element, characterized in that said all-pass filter circuit further comprises a second resistor connecting a common electrode of a transistor, included in the signal path from said signal input to the output electrode of said first transistor, to a common electrode of a transistor, which is included in the signal path from the second reference potential node to the output electrode of said other transistor of the second pair, and which has its output electrode connected to said signal output, so that a non-inverting signal path exists from said signal input to said signal output via said second resistor, said second resistor having a value such that the circuit arrangement constitutes said "all-pass" filter circuit.

3. An all-pass filter circuit as claimed in claim 1 or 2, wherein said first coupling means extends from said first load impedance to the control electrode of said third transistor, characterized in that said transistor, included in the signal path from said signal input to the output electrode of said first transistor, comprises said first transistor, and said transistor, which is included in the signal path from the last-mentioned reference potential point to the output electrode of said other transistor of the second pair, comprises said fourth transistor.

4. An all-pass filter circuit as claimed in claim 3, characterized in that the first and fourth transistors each have a first common electrode which is connected to the tail of the corresponding pair and a second common electrode which is connected to the second resistor.

5. An all-pass filter circuit as claimed in claim 1 or 2, characterized in that said transistor, included in the signal path from said signal input to the output electrode of said first transistor, comprises a fifth transistor, to a control electrode of which said signal input is connected, said fifth transistor having a common electrode connected to the control electrode of said first transistor and an output electrode connected to a fifth supply potential node, and said transistor, which is included in the signal path from the second reference potential point to the output electrode of said other transistor of the second pair, comprises a sixth transistor, to a control electrode of which said second reference potential node is connected, said sixth transistor having a common electrode connected to the control electrode of said other transistor of the second pair and an output electrode connected to the output electrode of said other transistor.

6. An all-pass filter circuit as claimed in claim 5, characterized in that said first capacitive element is connected to said first load impedance, said second capacitive element is connected to said second load impedance, said first coupling means includes a seventh transistor having a control electrode connected to said first load impedance, an output electrode connected to a sixth supply potential node and a common electrode connected to the control electrode of said one transistor of the second pair, and said second coupling means comprises an eighth transistor having a control electrode connected to said second load impedance, an output electrode connected to a seventh supply potential node and a common electrode connected to the control electrode of said second transistor.

7. An all-pass filter circuit as claimed in claim 6, characterized in that said supply potential nodes are interconnected and said reference potential nodes are interconnected.

* * * * *